US007168059B2

(12) United States Patent
Bowyer et al.

(10) Patent No.: US 7,168,059 B2
(45) Date of Patent: Jan. 23, 2007

(54) GRAPHICAL LOOP PROFILE ANALYSIS

(76) Inventors: Bryan Darrell Bowyer, 206 Ardus Dr., Newberg, OR (US) 97132; David Gaines Burnette, 14305 SW. 114th Ave., Tigard, OR (US) 97224; Ian Andrew Guyler, 28663 Crestwood Dr., Wilsonville, OR (US) 97070

( * ) Notice: Subject to any disclaimer, the term of this patent is extended or adjusted under 35 U.S.C. 154(b) by 381 days.

(21) Appl. No.: 10/126,913

(22) Filed: Apr. 19, 2002

(65) Prior Publication Data
US 2003/0005404 A1    Jan. 2, 2003

Related U.S. Application Data

(60) Provisional application No. 60/285,656, filed on Apr. 20, 2001.

(51) Int. Cl.
G06F 17/50 (2006.01)
(52) U.S. Cl. ............... 716/18; 716/1; 716/4; 716/5; 703/13; 703/14
(58) Field of Classification Search ............. 716/1, 716/4, 8, 18, 5; 715/771; 707/1; 703/13, 703/14, 16
See application file for complete search history.

(56) References Cited

U.S. PATENT DOCUMENTS

| | | | | |
|---|---|---|---|---|
| 6,233,540 | B1* | 5/2001 | Schaumont et al. | 703/14 |
| 6,606,588 | B1* | 8/2003 | Schaumont et al. | 703/15 |
| 6,701,501 | B1* | 3/2004 | Waters et al. | 716/8 |
| 2003/0131325 | A1* | 7/2003 | Schubert et al. | 716/4 |

OTHER PUBLICATIONS

Lakshminarayana et al., "Wavesched: a novel scheduling technique for control-flow intensive designs", May 1999, Computer-Aided Design of Integrated Circuits and Systems, IEEE Transactions on, vol. 18, Issue: 5, pp. 505-523.*
Ching-Yi et al., "High-level DSP synthesis using concurrent transformations, scheduling, and allocation", Mar. 1995, Computer-Aided Design of Integrated Circuits and Systems, IEEE Transactions on, vol. 14, Issue: 3, pp. 274-295.*
Liu et al., "Loop optimization for aggregate array computations", May 14-16, 1998, Computer Languages, 1998. Proceedings. 1998 International Conference on, pp. 262-271.*

(Continued)

*Primary Examiner*—Jack Chiang
*Assistant Examiner*—Helen Rossoshek
(74) *Attorney, Agent, or Firm*—Klarquist Sparkman LLP

(57) ABSTRACT

A tool is disclosed that allows a hardware designer using a behavioral synthesis tool to view a calculated execution time for a group of related loops identified in source code describing a hardware design circuit. Further, a designer can then interactively unroll and/or pipeline a selected loop without having to modify the source code description of the circuit. Using a graphical user interface (GUI), the designer can modify the loop design easily and see the results of the new loop configuration without having to generate the RTL code, perform RTL synthesis, etc. For example, the designer can readily view the relative loop execution time of the circuit to better determine whether the design is acceptable. Additionally, the designer can execute an area-versus-latency analysis, and, if the analysis is not satisfactory, the designer can unroll and or pipeline selected loops using the GUI.

29 Claims, 20 Drawing Sheets

OTHER PUBLICATIONS

Ravi et al., "Removal of memory access bottlenecks for scheduling control-flow intensive behavioral descriptions", Nov. 8-12, 1998,Computer-Aided Design, ICCAD, Digest of Technical Papers. IEEE/ACM International Conference on, pp. 244-250☐☐.*

Bhattacharya et al., "Performance analysis and optimization of schedules for conditional and loop-intensive specifications", 1994, Annual ACM IEEE Design Automation Conference 31st annual conference on Design automation, pp. 491-496.*

U.S. Appl. No. 09/839,376, filed Apr. 20, 2001, Prakash et al.

U.S. Appl. No. 09/919,650, filed Jul. 31, 2001, Gutberlet et al.

U.S. Appl. No. 09/957,442, filed Sep. 18, 2001, Waters et al.

U.S. Appl. No. 60/362,679, filed Mar. 8, 2002, Prakash et al.

U.S. Appl. No. 10/126,911, filed Apr. 19, 2002, Burnette et al.

"Loops", *Understanding Behavioral Synthesis (A Practical Guide to High-Level Design)*, by John P. Elliott, Chapter 6, pp. 77-103 (1999).

"Pipelining", *Understanding Behavioral Synthesis (A Practical Guide to High-Level Design)*, by John P. Elliott, Chapter 8, pp. 137-154 (1999).

* cited by examiner

| Solution_1(LOOPS) Constraints | | | | |
|---|---|---|---|---|
| Loop Hiearchy | Freq | Unrol | Pipelin | # Ops |
| DESIGN: JPEG_Compress_sid0 | | (n) | | |
| PROCESS: JPEG_Compress_proc | | (n) | | |
| LOOP: JPEG_Compress_main | | (n) | no | |
| LOOP: start_wuc | | (n) | no | |
| LOOP: compress | | (n) | no | |
| LOOP: mult1 | 8 | (n) | no | |
| LOOP: inner1 | 8 | (n) | no | |
| LOOP: inner1_for | 8 | (n) | no | |
| LOOP: mult2 | 8 | (n) ⤶330 | no | |
| LOOP: inner2 | 8 | (n) | no | |
| LOOP: inner2_for | 8 | (n) | no | |
| LOOP: divide_for | 11 | yes | no | |
| LOOP: compress_for | 6 | no | no | |
| LOOP: nibble | | Partial (Default) | no | |
| LOOP: nibble_while | | | no | |

Help | clear | OK | Apply | Cancel

FIG. 12

| Loop Hiearchy | Freq | Unroll | Pipelining | # Ops |
|---|---|---|---|---|
| DESIGN: JPEG_Compress_sid0 | | (n) | | |
| PROCESS: JPEG_Compress_proc | | (n) | | |
| LOOP: JPEG_Compress_main | | (n) | no | |
| LOOP: start_wuc | | (n) | no | |
| LOOP: compress | | (n) | no | |
| LOOP: mult1 | 8 | (n) | no | |
| LOOP: inner1 | 8 | (n) | no | |
| LOOP: inner1_for | 8 | (n) | no | |
| LOOP: mult2 | 8 | (n) | no | |
| LOOP: inner2 | 8 | (n) | no | |
| LOOP: inner2_for | 8 | (n) | no | |
| LOOP: divide_for | 11 | y | 1 | |
| LOOP: compress_for | 6 | y | 2 | |
| LOOP: nibble | | (n) | 1 no rampup | |
| LOOP: nibble_while | | (n) | 2 no rampup | |

334 (pointing to Pipelining dropdown with options: no, 1, 2, 1 no rampup, 2 no rampup, Other)

Help | Clear | OK | Apply | Cancel

FIG. 13

Solution_1(LOOPS) Constraints

| Loop Hierarchy | Freq | Unroll | Pipelining | # Ops |
|---|---|---|---|---|
| DESIGN: JPEG_Compress_sid0 | | (n) | | |
|   PROCESS: JPEG_Compress_proc | | (n) | | |
|     LOOP: JPEG_Compress_main | | (n) | no | |
|       LOOP: start_wuc | | (n) | no | |
|       LOOP: compress | | (n) | no | |
|         LOOP: mult1 | 8 | (n) | no | |
|           LOOP: inner1 | 8 | (n) | 4 | |
|             LOOP: inner1_for | 8 | yes | no | |
|         LOOP: mult2 | 8 | (n) | no | |
|           LOOP: inner2 | 8 | (n) | 4 | |
|             LOOP: inner2_for | 8 | yes | no | |
|             LOOP: divide_for | 11 | y | no | |
|         LOOP: compress_for | 6 | y | no | |
|         LOOP: nibble | | (n) | no | |
|           LOOP: nibble_while | | (n) | no | |

Help | Clear | OK | Apply | Cancel

| Loop Hierarchy | Sc | PERCENTAGE |
|---|---|---|
| SEQUENTIAL "JPEG_Compress_ | | 0% |
|   LOOP "JPEG_ Compress_main | | 0% |
|     LOOP "start wuc" | | 8% |
|     LOOP "compress" | | 0% |
|       LOOP "mult1" | | 0% |
|         LOOP "inner1" | | 5% |
|           LOOP "inner1_for" | | 34% |
|       LOOP "mult2" | | 0% |
|         LOOP "inner2" | | 6% |
|           LOOP "inner2_for" | | 39% |
|     LOOP "nibble" | | 2% |
|       LOOP "nibble while" | | 6% |

GRAPHICAL LOOP PROFILE ANALYSIS

RELATED APPLICATION DATA

This application is based on provisional application Ser. No. 60/285,656, filed Apr. 20, 2001, which is incorporated herein by reference.

TECHNICAL FIELD

This invention relates generally to behavioral synthesis tools for creating integrated circuits, and more particularly, relates to the representation of loop execution time in a behavioral synthesis tool.

BACKGROUND

The design of complex computer hardware no longer begins with a circuit diagram. Instead, it begins with a software program that describes the behavior or functionality of a circuit. This software program is written in a hardware description language (HDL) that defines an algorithm to be performed with limited implementation details. Designers direct behavioral synthesis tools to generate alternate architectures by modifying constraints (such as clock period, number and type of data path elements, and desired number of clock cycles). Behavioral synthesis tools convert the HDL program into a register transfer level (RTL) description. The RTL description is used to ultimately generate a netlist that includes a list of components in the circuit and the interconnections between the components. This netlist is used to create the physical integrated circuit. One characteristic of RTL code is that the RTL code is specified for each clock event, while a behavioral specification has a more abstract timing or no timing at all. Going from a behavioral specification to RTL code (manually or automatically) requires a determination of the clocked behavior. In behavioral synthesis this essential step is called scheduling.

An example HDL source code is shown in Table 1 below that declares three variables, a, b, and c, that are arrays. Each array contains 1024, 8-bit words. The code first declares a "subtype" to define the type of each element in the array. The code then defines a "type" to represent the array itself. Finally, the variables are declared, each variable representing an array.

TABLE 1

SUBTYPE word IS unsigned (7 DOWNTO 0);
TYPE array_type IS ARRAY (integer RANGE <>) of word,
VARIABLE a, b, c: array_type (0 to 1023)

Generally, the variables are accessed using loops, such as the loop shown below in Table 2.

TABLE 2

FOR i IN 0 TO 15 LOOP
  a(i) := b (i) * c(i) +4;
END LOOP;

After the designer completes the HDL source code (which may include pragma statements or other directives), the designer runs the source code through the synthesis tool. The synthesis tool generates a report that the designer can use to analyze the performance of the circuit. For example, the user can examine the area and latency of the circuit to determine whether the current loop configuration is acceptable. If the loop configuration is not acceptable, the designer must return to an editor, re-edit the source code to unroll or pipeline loops, and run the source code through the synthesis tool again. Such a technique for modifying the design is time consuming and inefficient. Moreover, the designer cannot easily visualize how the loop configuration changes the design while modifying the source code.

It is desirable, therefore, to provide a synthesis tool that allows a designer to easily identify loops where execution time is relatively inefficient, and unroll or pipeline those loops more quickly and simply. Scheduling determines the number of cycles to perform a static segment of the specification (e.g., one iteration of a loop). How this translates into the dynamic timing of the design depends if and how often each code segment is executed. Segments of the code are repeated over and over again in loops, so the user needs a way to go from the static timing of a scheduled specification to the dynamic timing when executing the specification with actual input values. It is desirable to allow a designer to readily visualize relative loop execution time in the context of dynamic timing.

SUMMARY

The present invention allows a hardware designer using a behavioral synthesis tool to view a calculated execution time for a group of related loops identified in source code describing a hardware design circuit. Further, a designer can then interactively unroll and/or pipeline loops without having to modify the source code description of the circuit. Using a graphical user interface (GUI), the designer can modify the loop design easily and see the results of the new loop configuration without having to generate the RTL code, perform RTL synthesis, etc. For example, the designer can readily view the relative loop execution time of the circuit to better determine whether the design is acceptable. Additionally, the designer can execute an area-versus-latency analysis, and, if the analysis is not satisfactory, the designer can unroll and or pipeline selected loops using the GUI.

In one aspect, a source code file having a description of the hardware is read into a database within the synthesis tool. The synthesis tool analyzes the source code file and generates a data structure associated with the source code file. The designer can then invoke a GUI that displays a graphical loop profiling analysis including displaying the loops, together with a relative representation of time spent within each loop. The designer can then interactively unroll and or pipeline loops without having to change the source code file. In one embodiment, a graphical loop profile panel is displayed in the context of a loop hierarchy panel and a process scheduler panel.

Further features and advantages of the invention will become apparent with reference to the following detailed description and accompanying drawings.

BRIEF DESCRIPTION OF THE DRAWINGS

FIG. 12 is an illustration of a graphical user interface displaying loop constraints wherein the designer unrolls a loop.

FIG. 13 is an illustration of a graphical user interface displaying loop constraints wherein the designer pipelines a loop.

FIG. 14 is an illustration of a graphical user interface displaying loop constraints wherein the designer applies changes made in FIGS. 12 and 13.

FIG. 17 is an illustration of an alternative relative loop analysis display using percentage loop execution time.

DETAILED DESCRIPTION

Figure 1:
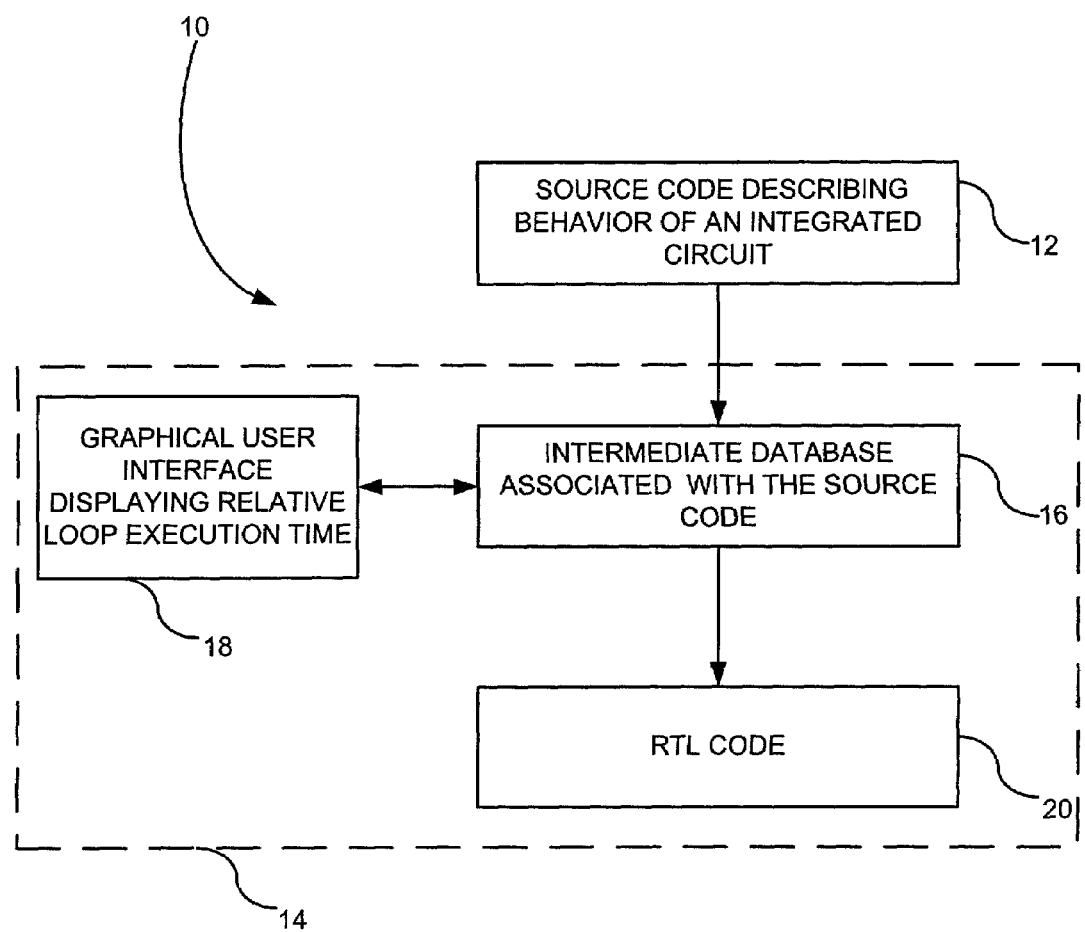
FIG. 1 is a block diagram of a system for allowing graphical loop profiling analysis.

FIG. 1 shows a system 10 for generating an integrated circuit. A designer typically creates a behavioral description of an integrated circuit by generating source code file 12 using a separate editor (not shown). The source code is described generically as HDL and may be written in C, C++, VHDL, Verilog, etc. Once the source code 12 is complete, a behavioral synthesis tool 14 reads in the source code file 12 and allows a designer to evaluate and modify the circuit architecture early in the design process. In particular, the source code 12 is read into an intermediate database 16 that holds the behavioral description as a data structure. This data structure, called a synthesis intermediate format (SIF), is modifiable by the user through a graphical user interface (GUI) 18. The behavior synthesis tool then identifies the loops within the source code, and calculates the execution time spent in the identified loops. The GUI 18 then displays the relative execution time spent in the identified loops. In one embodiment, a GUI also allows the designer to unroll and or pipeline identified loops where execution time is greatest. By focusing design changes on loops with the greatest execution time, the overall execution time can be efficiently reduced. Additionally, the designer may also quickly evaluate the area and latency associated with different pipelining and unrolling combinations. Once the designer is satisfied with the architecture, the RTL code is generated as shown at 20. Further processing is then performed on the RTL code to ultimately generate the integrated circuit. The behavioral synthesis tool 14 may be executed on any desired general purpose computer having any display device or monitor for displaying the GUI and having any desired user input, such as a mouse, keyboard, etc.

In previous systems, the designer had no relative representation of total time spent in loops, so it was more difficult to determine where to focus design alterations. For example, a loop that has only a few hardware operations compared to the rest of the design, may represent the majority of the execution time, because that loop is executed hundreds of times. With the relative loop execution time displayed, a designer can focus on optimizing the design where the results most efficiently reduce execution time for the integrated circuit.

Figure 2:
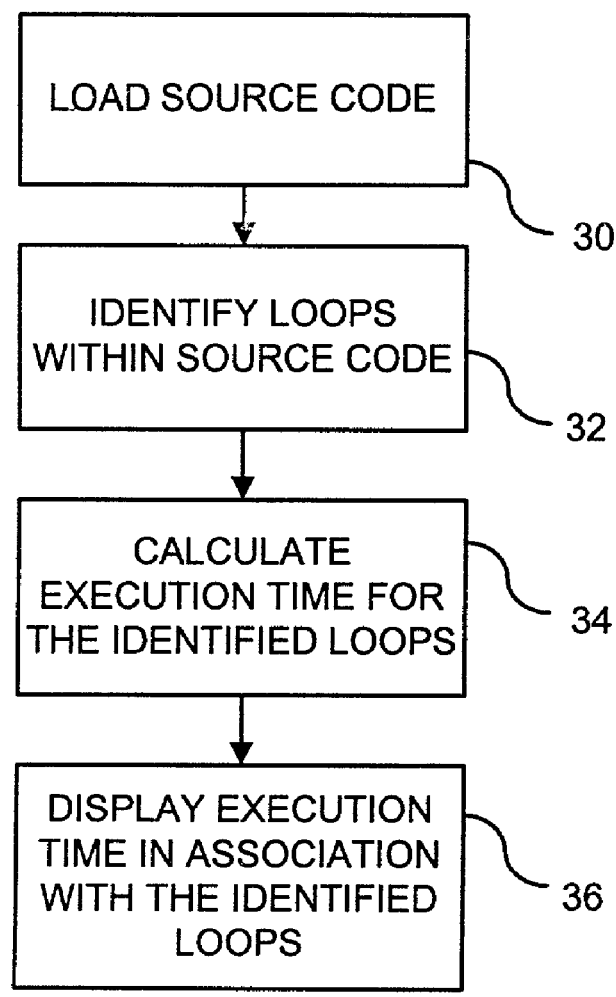
FIG. 2 is a design flow for creating a graphical loop profile display.

FIG. 2 shows a flow chart for generating an integrated circuit according to a hardware design tool. The source code is loaded 30 into the design tool. The design tool identifies loops within the source code 32. The design tool then calculates the estimated time that each loop will execute 34. The design tool then displays the estimated execution time for the identified loops 36.

Figure 3:
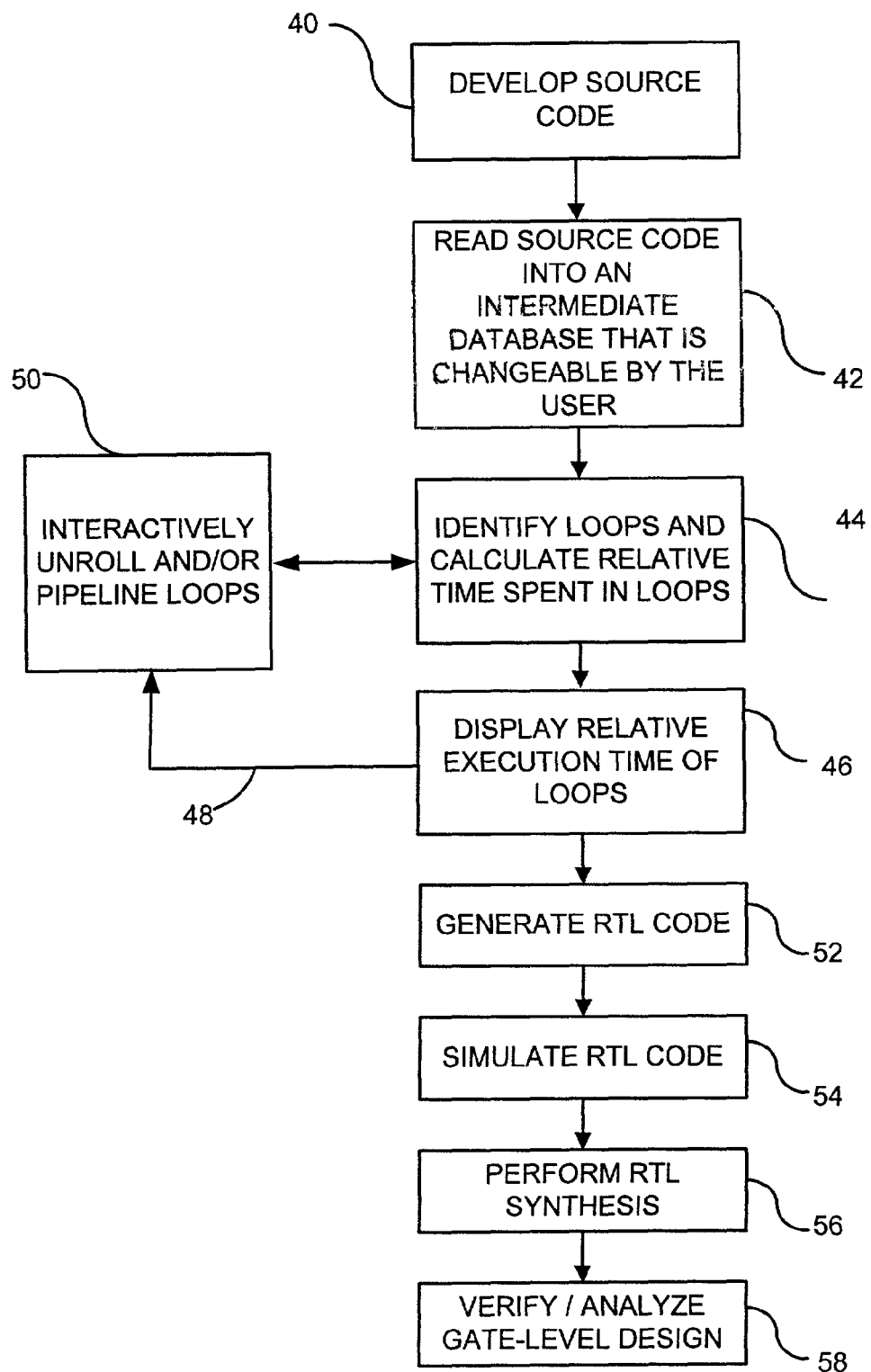
FIG. 3 is a more detailed flow chart for a hardware circuit design utilizing relative loop profile analysis.

FIG. 3 shows a more detailed flow chart for generating an integrated circuit. In process block 40, the designer develops the source code as already described. The behavioral synthesis tool 14 (see FIG. 1) reads the source code 42 into the intermediate database 16 and generates a data structure that is changeable by the designer. When generating the data structure, the synthesis tool performs an analysis of the source code 42. For example, the synthesis tool searches for operators, signals, and variables in the source code and generates the data structure based on these HDL statements. Additionally, the synthesis tool searches for directives and uses the directives and/or a set of default selections to set a hardware description in the data structure. The data structure is a data model that can represent loops in a variety of forms the most general being a mapping of the source code as when first read into the behavioral synthesis tool.

The synthesis tool also identifies the loops 44 in the source code, and calculates in conjunction with the hardware description in the data structure, the relative execution time spent in the identified loops 44. This calculation of estimated execution time within loops, can be accomplished a number of ways. The hardware description (e.g., adders, multipliers, flip-flops, memory devices, etc.) has an associated execution time for operations identified within the identified loops. The calculation can estimate execution time by measuring the time required to complete the hardware operations in a loop according to the hardware description. Then multiply the loop calculated execution time with the number of loop iterations identified in the source code to obtain the execution time for a loop.

Another method involves estimating the number of clock cycles in the source code for the design, and multiplying by the time required for an estimated clock cycle for the design. For example, the hardware operations within the loop are assigned to clock cycles within a loop, thereby determining the number of clock cycles needed to complete each iteration of the loop. The number of clock cycles can then be multiplied by the number of loop iterations to find a total number of clock cycles for the loop. This total number of loop cycles can be multiplied by the clock period to obtain the execution time for the loop. However loop execution time units can be represented as total clock cycles or total execution time, so long as the loops being compared have the same units.

Pipelined loops can be used in designs to reduce latency. The initialization interval of a pipelined loop specifies the rate at which the pipelined component can begin processing new input data. When a designer decides to pipeline a selected loop, they indicate a pipeline input value (e.g., a pragma statement in the source code, or later interactively, e.g., FIG. 13, at 334). This input represents the initialization interval (e.g., number of clock cycles) required before the pipelined loop can begin processing new input data. This initiation interval is used to calculate the execution time for a pipelined loop.

This calculation of execution time for pipelined loops can be estimated a number of ways. For example, the hardware description of the pipelined loop has an associated execution time for the operations completed within the pipeline. These operations can be assigned to clock cycles to obtain the number of clock cycles required to complete the pipeline once. However the pipelined can begin processing new data (i.e., a next iteration, initiation, or entry into the pipeline) before all instructions in the pipeline are completed. In this way, the pipeline can begin processing input for a second iteration before the first iteration completes. To calculate the time required in waiting before starting a next iteration, the initiation interval described in the previous paragraph is used. Each initiation of the pipeline can begin consecutively after waiting one initiation interval after the previous initiation of the pipeline. Thus, to calculate the execution time of a pipelined loop, the following equation is used: number of clock cycles in the pipeline+(initiation interval*(number of iterations −1)). This produces a total number of clock cycles which can be used directly for relative comparison or multiplied by the clock period to obtain an estimated execution time for relative comparison.

Of course, as the design changes, these estimations change accordingly. Once the execution time estimation is calculated for each loop, the entire execution time for the design is known, and relative execution times can be calculated. These relative loop execution times can express the relative time relationships parent loops have with child loops and grand-child loops, as well as sibling child loops within the same parent loops.

The synthesis tool then displays the execution time of the loops 46. The display can be any graphical representation of numeric representation that allows the designer to appreciate the estimated execution time within a loop as compared to the total execution time or as compared to the execution time spent in one or more other loops. The selected display can be more helpful, if it allows the designer to readily discover execution time spent in one loop as compared to another. For example, if a design executes in a hierarchy of nested loops, and the majority of the total estimated execution time is spent in one or more of the loops, the designer might unroll or pipeline those loops to quickly reduce overall execution time. By representing the loop execution times in the context of sibling and or parent-child loop relationships, the illustrated embodiment greatly enhances the efficient development of a hardware circuit.

Once a designer knows the loops where the greatest execution time is spent, the designer can select the loop, and unroll or pipeline the loop. In one embodiment, the designer makes changes to the source code indicating a new hardware circuit configuration wherein the selected loop is unrolled and or pipeline. Thus, the graphical representation of relative loop execution time allows intelligent choices in hardware design thereby reducing the time required to change the source code. Such an embodiment would not include process block 50, of FIG. 3.

However, in another embodiment, a designer can interactively unroll or pipeline the selected loop 50. This feature allows the designer to make interactive changes to the initial hardware description and design structure represented in the data structure (FIG. 1, 16). For example the designer can interactively select a loop, unroll the loop, and/or pipeline the loop 50. With these changes, the data structure representation changes, without requiring the designer to write source code. One embodiment of a design tool can then be used to re-calculate the relative time spent in the altered design 44, and display the relative time of the loops in the altered design 46. This iterative process of unrolling or pipelining loops in the design, continues until the designer decides that a proper balance of speed and size has been realized for the circuit under design. Optionally, the tool can perform a check to analyze the area and latency of the circuit. This may be displaying in an area versus latency graph that gives the designer some immediate feedback on whether the design is satisfactory (e.g., FIG. 11)

If the designer is unhappy with the displayed relative execution time of the loops or the displayed area versus latency graph, the designer can return to process block 50 to further modify the loops, as shown by arrow 48. On the other hand, if the designer is satisfied with the design, the RTL code can be generated and simulated (process blocks 52 and 54). Finally, an RTL synthesis tool can perform RTL synthesis (process block 56) and the gate level design can be verified and analyzed (process block 58).

Figure 4:
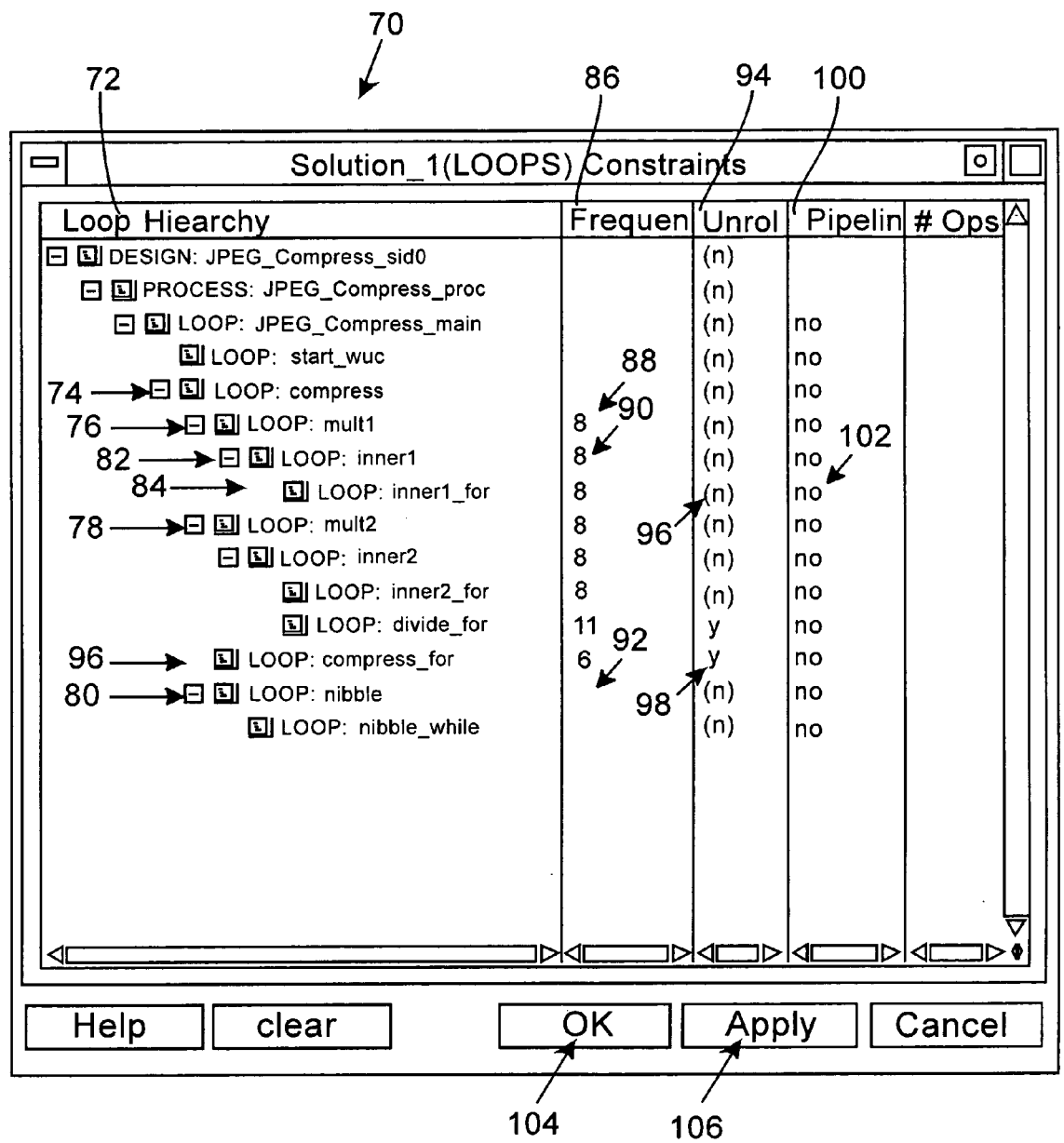
FIG. 4 is an illustration of a graphical user interface displaying loop constraints.

FIG. 4 shows an example of a loop constraint user interface 70 that shows a loop hierarchy panel 72 for displaying the family relationships of the loops, after the loops have been identified in the source code by the behavioral synthesis tool (e.g., FIG. 3, 44). For example, the loop "compress" 74 is the parent of three child loops "mult1" 76, "mult2" 78, "compress_for" 96, and "nibble" 80. Further, "inner1" 82 is a grandchild of "compress" 74, and "inner1_for" 84 is a great grandchild of "compress".

The loop constraint user interface 70, also has a loop frequency panel 86 that indicates the number of times each loop will be executed. For example, the loop "mult1" 76 will be executed "8" times (as shown at 88), and the loop "inner1" will be executed "8" times (as shown at 90). However, since loop "inner1" is a child of loop "mult1", this family relationship indicates that "inner1" will execute 8 times each time "mult1" executes. Thus, loop "inner1" will execute a total of 64 times. Finally, since the source code did not indicate the number of times loop "nibble" 80 will execute, the frequency panel has no corresponding loop frequency value 92 for "nibble". For each such undefined loop frequency value, the synthesis tool will assume a default loop execution frequency value of 1. However, the loop constraint user interface is an interactive interface (e.g., FIG. 3, 50), so the user can change the default loop frequency value by entering a new value (at the space shown at 92).

The loop constraint user interface 70 also contains a loop unroll panel 94. The loop unroll panel indicates for each loop, whether or not that loop is unrolled. For example, the loop unroll panel indicates that loop "inner1_for" 84 is not ("(n)") unrolled 96. When the source code is first read into the behavioral design tool, the code itself may indicate in pragma statements to unroll a given loop. For example, in this case the loop "compress_for" 96 started in an unrolled state "y" 98 according to a pragma instruction contained in the source code. However, the loop constraint user interface 70 is interactive. During the design process, a designer can change the state of the loops from rolled to unrolled, or from unrolled to rolled. This allows the designer to change the description of the data structure (e.g., FIG. 3, 42) without developing new source code 40.

The loop constraint user interface 70 also contains a loop pipeline panel 100. The loop pipeline panel indicates for each loop, whether or not that loop is pipelined. For example, the loop pipeline panel indicates that loop "inner1_for" 84 is not ("no") pipelined 102. When the source code is first read into the behavioral design tool, the code itself may indicate in pragma statements to pipeline a given loop. However, the loop constraint user interface 70 is interactive. During the design process, a designer can change the state of the loops from not pipelined to pipelined, or from pipelined to not pipelined. This allows the designer to change the description of the data structure (e.g., FIG. 3, 42) without developing new source code 40.

Once the designer has viewed a start state of the loops 70, the designer can click "OK" 104, and view the next window. However, if the designer makes changes to the loops, the designer can "Apply" 106 those changes. In either event, the designer can next view the schedule for the design.

Figure 5:
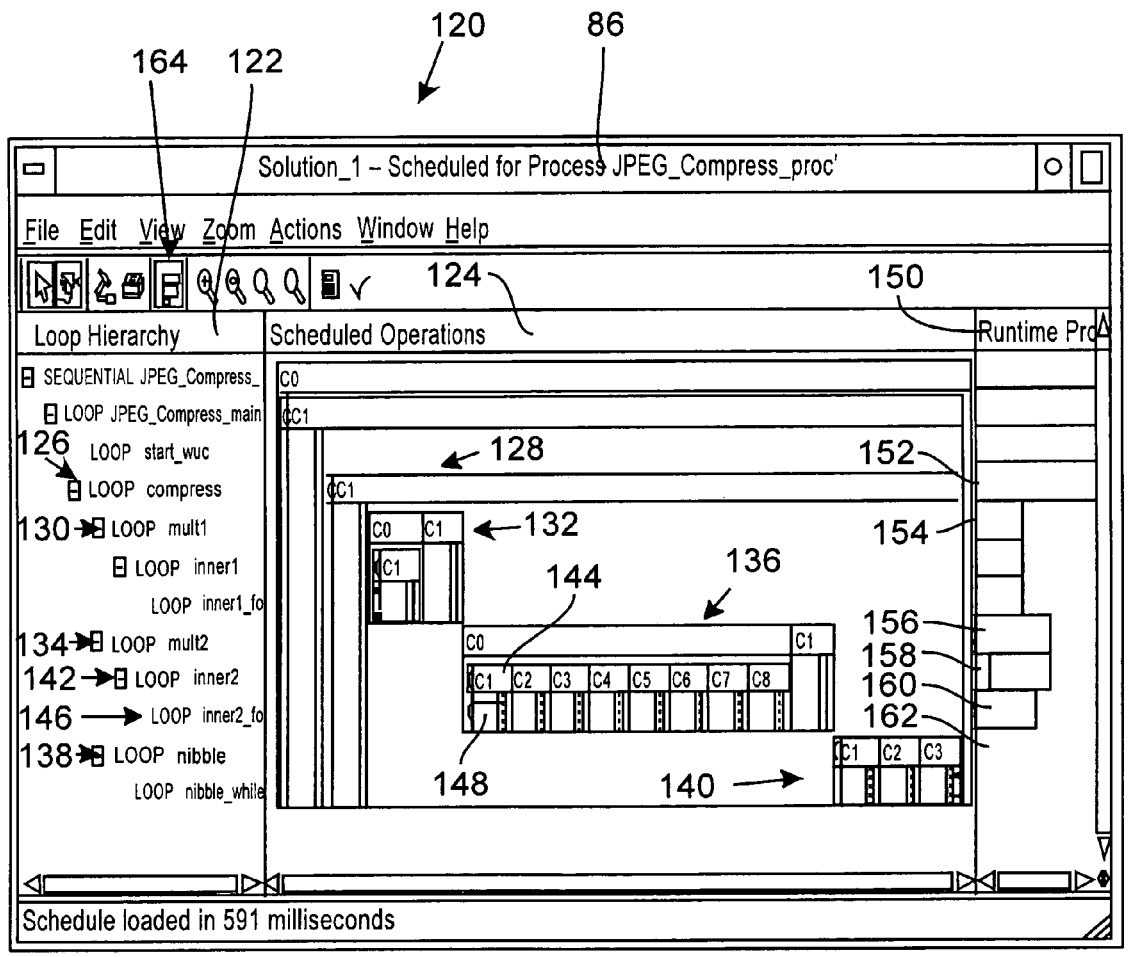
FIG. 5 is an illustration of a graphical user interface displaying process scheduling including a runtime profile panel.

FIG. 5 shows an example of a process schedule user interface 120 that shows a loop hierarchy panel 122 for displaying the family relationships of the loops. The process schedule user interface 120, has a scheduled operations panel 124, which includes a graphical representation of the family relationships of the loops, along with an indication of the clock cycles estimated for each loop (e.g., C0, C1, C2 . . . ).

For example, the loop "compress" 126, is shown in the scheduled operations panel as a box 128 containing three child boxes 132, 136, and 140. The loop "mult1" 130 is shown in the scheduled operations panel as a box 132 inside the box 128 representing its parent loop "compress" 126. Since "mult1" 130, "mult2" 134, and "nibble" 138, are all direct children of "compress" 126, they each are individually distinguishable boxes 132, 136, 140, inside the box 128 representing their parent loop "compress" 126. Notice that boxes 132, 136, representing sibling child loops, appear within their common parent box 128, but do not appear inside each other. Also notice, that the top of each box in the scheduled operations panel 124 appears directly across from the loop it represents in the loop hierarchy panel 122.

The scheduled operations panel also represents multiple level descendent relationships such as grandparent-grandchild. For example, loop "compress" 126 is a parent of loop "mult2" 134, a grandparent of loop "inner2" 142, and a great grandparent of loop "inner2_for" 146". This relationship is represented in the scheduled operations panel as a hierarchy of boxes nested within boxes in multiple layers. For example, a parent box 128 has a child box within itself 136, a grandparent box 128, has a grandchild box 144 within its child box 136, and a great grandparent box 128, has its great grandchild box 148, within its grandchild box 144. Thus, in the scheduled operations panel sibling relationships are next to each other 132, 136 and within a their parent 128, while descendent relationships are nested within each other (e.g., child within parent, grandchild within child, etc).

The process schedule user interface 120, also has a runtime profile panel 150. This panel represents the relative calculated runtime of the identified loops. The panel will be discussed in depth in the following drawings. But first, there is a horizontal relationship between the loop hierarchy panel 122, the scheduled operations panel 124, and the runtime profile panel 150. In particular, the loop "compress" 126 is on the same horizontal line as its box 128, and its runtime profile bar graph 152. Thus, the relative execution time of "mult1" 130 can be compared to the relative execution time of "mult2" 134, by comparing the width of their corresponding bar graphs, respectively 154, 156. Since the "mult2" bar 156 is wider than the "mult1" bar 132, more time is spent executing within "mult2".

Also notice, that the time spent in a parent includes the time spent in its children, grandchildren, and great grandchildren, etc. Thus, the sum of the "mult1" bar 154, the "mult2" bar 156, and the "nibble" bar, should be less than or equal to the size of the bar representing their common parent 152.

Next, notice that the runtime profile panel includes bars of different shades and or colors. For example, the bar 160 is darker than bar 156. Further, bar 158 has multiple shades. These multiple colors or shades help the designer determine whether work is being done in a loop or the child of a loop. This concept will be fully developed in conjunction with FIGS. 7–9.

Finally, the process schedule user interface 120, has a loop only button 164. FIG. 5 represents a view of the process schedule interface 120 when the loop only button 164 is selected. If the designer un-clicks the loop only button 164, FIG. 6 appears.

Figure 6:
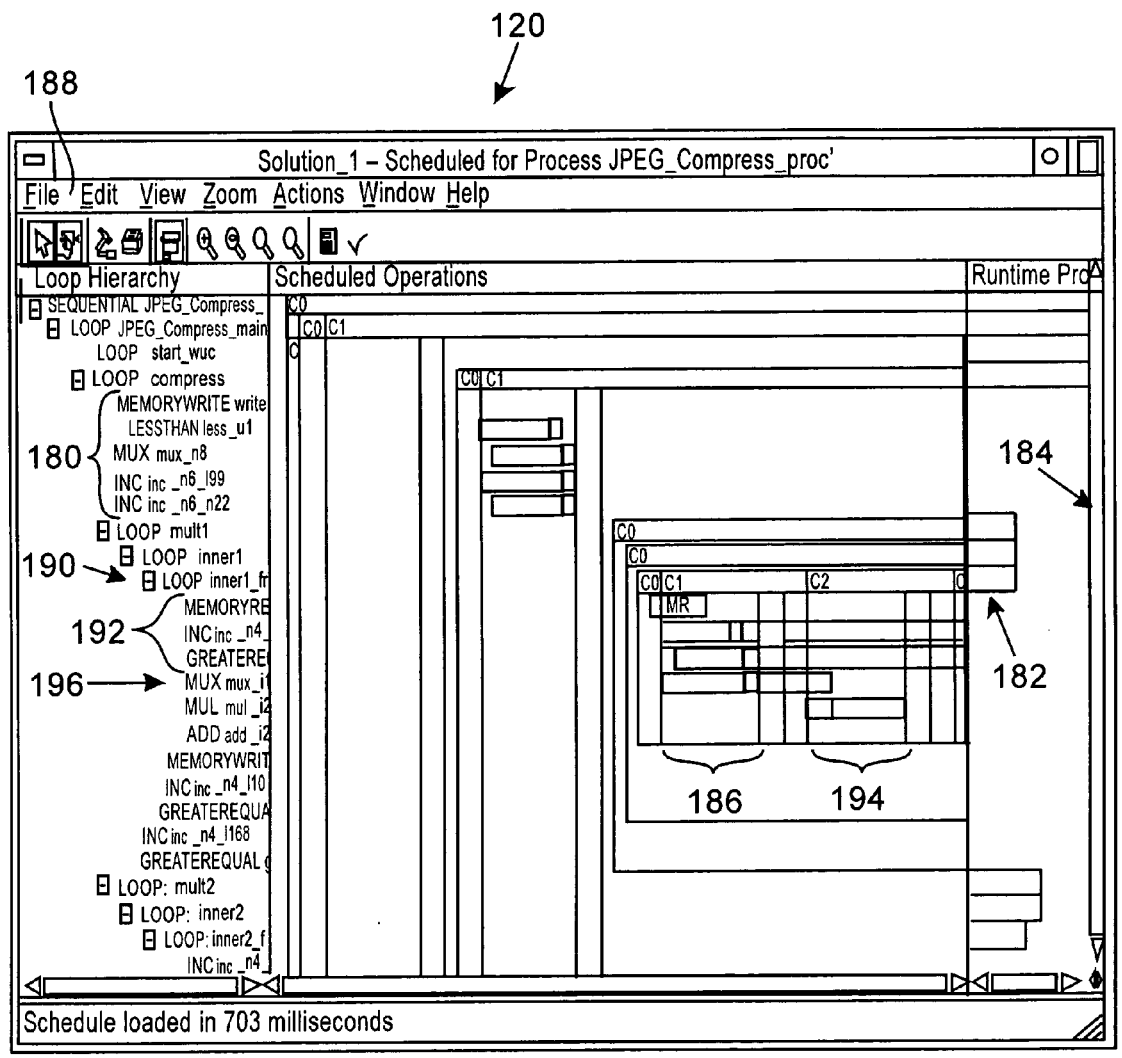
FIG. 6 is an expanded illustration of FIG. 5 including hardware operations within loops.

FIG. 6, is still the process schedule interface 120, but it includes not only the loops scheduled, but the hardware operations within each loop. For example, loop "compress" contains five hardware operations 180 before entering the loop "mult1".

FIG. 6, shows the clock cycles within each loop, and the hardware operations that occur during the clock cycles. For example, within the loop "inner1_for" 190, three hardware operations 192 are executed in the first clock cycle 186, and one hardware operation 196 is executed in the second clock cycle 194.

Since the loops have been spread out vertically in order to make room for the instructions within loops, the bars representing execution times 182 are also spread out vertically in the runtime profile panel. A scroll bar 184 is provided to traverse the design pattern, and standard-type window pulldowns 188 provide controls and other features such as printing, zoom, edit functions, etc.

Figure 7:
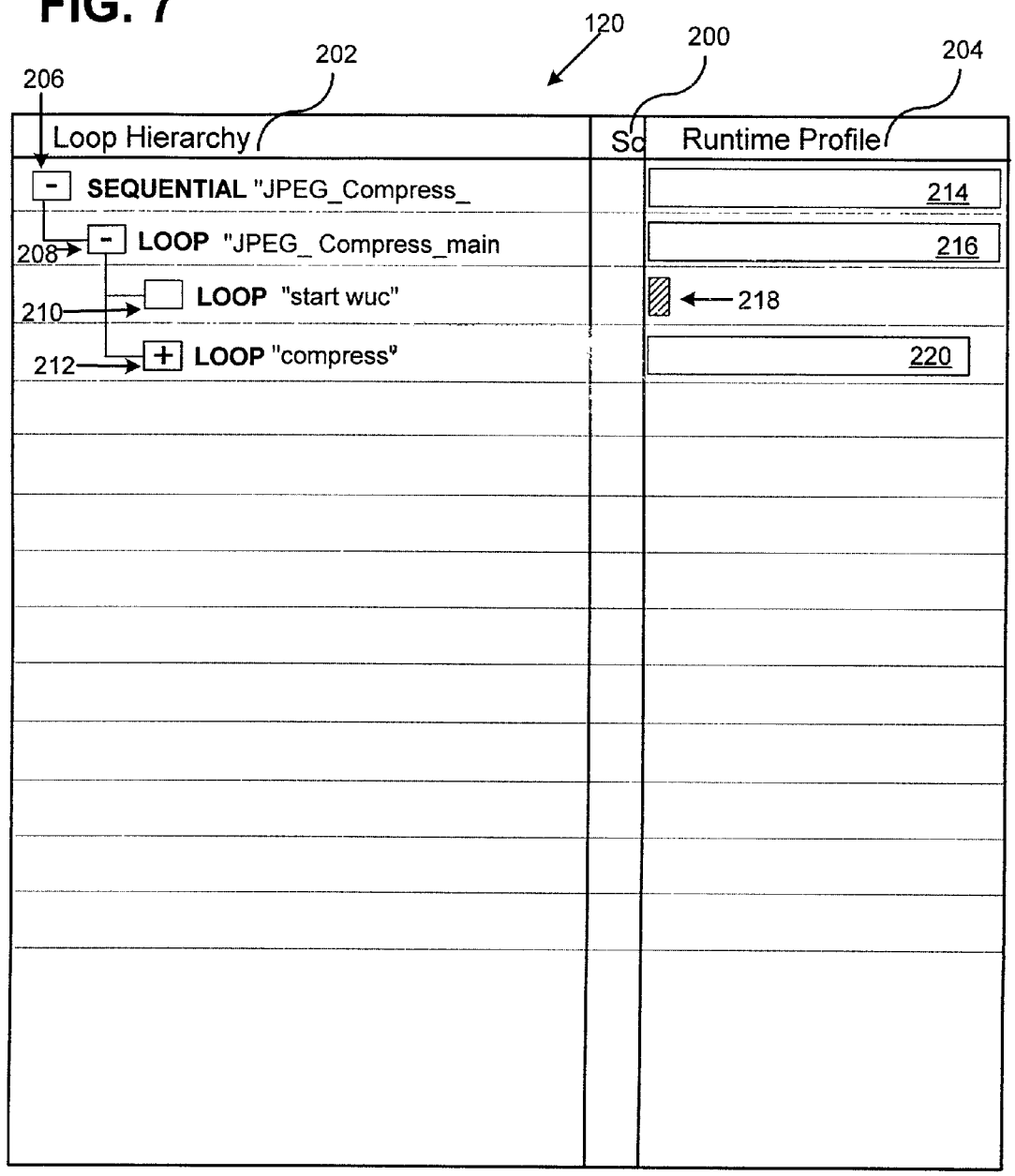
FIG. 7 is an illustration of a graphical user interface displaying process scheduling including a runtime profile panel.

With reference to FIG. 7, the diagram focuses on two panels contained within the process schedule user interface 120 of FIGS. 5 and 6. The discussion focuses on the relationship between the loop hierarchy panel 202, and the runtime profile panel 204 in order to fully develop the useful nuances of this runtime profile panel 204 embodiment. The scheduled operations panel 200 has been pulled closed. Remember, the time spent in a loop is represented by its corresponding bar in the runtime profile panel 204.

The loop hierarchy panel 202 contains a tree structure that represents the nested parent child relationships between loops. For example, since "start wuc" 210 and "compress" are direct children of "JPEG_Compress_main", they are lined up vertically in the tree structure under "JPEG_Compress_main".

Since "JPEG_Compress_" 206 is the shell for the source code, all execution time exists within its corresponding bar in the runtime profile panel 214. The execution time for the entire design is represented in bar 214. However, the design immediately enters the first loop "JPEG_Compress_main" 208, so almost all time is also in the bar 216, which represents "JPEG_Compress_main" 208. Bar 216 and bar 214 represent almost exactly the same time, so they appear the same size.

Next, "JPEG_Compress_main" 208 contains two loops. Very little time is spent in the first loop "start wuc" 210, so its corresponding bar 218 is very small. Since more time is spent in "compress" 212, its corresponding bar 220 is much larger. In this case the children of "JPEG_Compress_main" ("start wuc" and "compress") contain all the instructions executed within "JPEG_Compress_main". So the sum of the child bars 218 and 220, equals the size of the parent bar 216. Again, bar 218 plus bar 220 is equal to bar 216.

Finally, the plus sign "+" in front of the "compress" loop 212 indicates that there is an expandable loop tree structure under "compress." The designer clicks the plus "+" sign 212 in order to expand the tree structure and exam the loops nested under "compress".

Figure 8:
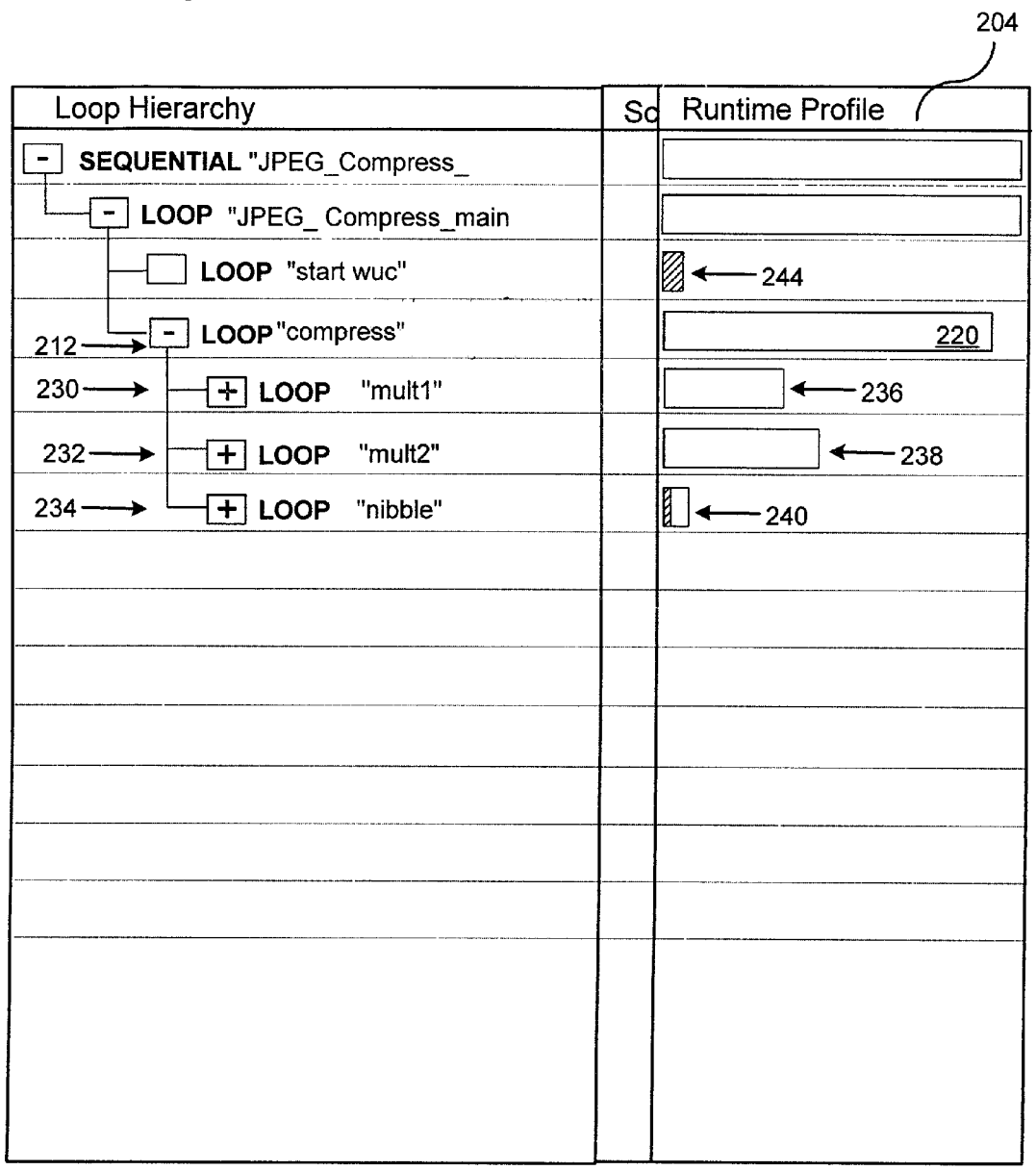
FIG. 8 is an illustration of a graphical user interface displaying process scheduling including showing an expanded tree structure.

FIG. 8 shows what happens when the tree structure is expanded under "compress". First, notice that the minus sign "–" 212 indicates that the tree under "compress" 212 has been expanded. The loop "compress" 212, has three direct children, "mult1" 230, "mult2" 232, and "nibble" 234. Also, the runtime profile panel 204 shows the relative execution time 236, 238, and 240, of each of the direct children. Again, we see that the sum of the child bars 236, 238, and 240, roughly equal the parent 220. Thus, if a designer were interested in selecting a loop for increased efficiency, the loop represented by bar 238, would be a better selection than loop 240, since it represents a greater execution time. However, the shading represents information that may also be valuable in a design decision.

Notice that all three child bars 236, 238, and 240 contain at least some lighter shade (which in this case appears white). Specifically, bars 238 and 236 appear all white. This amount of the lighter shade in a bar, signals to the designer, that one of their child loops is doing more work (execution time). The lighter shade 236, 238 signals to the designer, that by expanding the tree under loops "mult1" 230 and "mult2" 232, the designer may find a good child candidate loop for unrolling and or pipelining.

When a bar is 100% dark 244, it signals to the designer that it is doing all the work (execution time), and that it does not have a child that would be a good candidate for unrolling or pipelining. If a bar has a dark portion and a light portion 240, the light portion indicates work (execution time) being done by a child loop, and the dark portion indicates the work being done by the loop itself.

Figure 9:
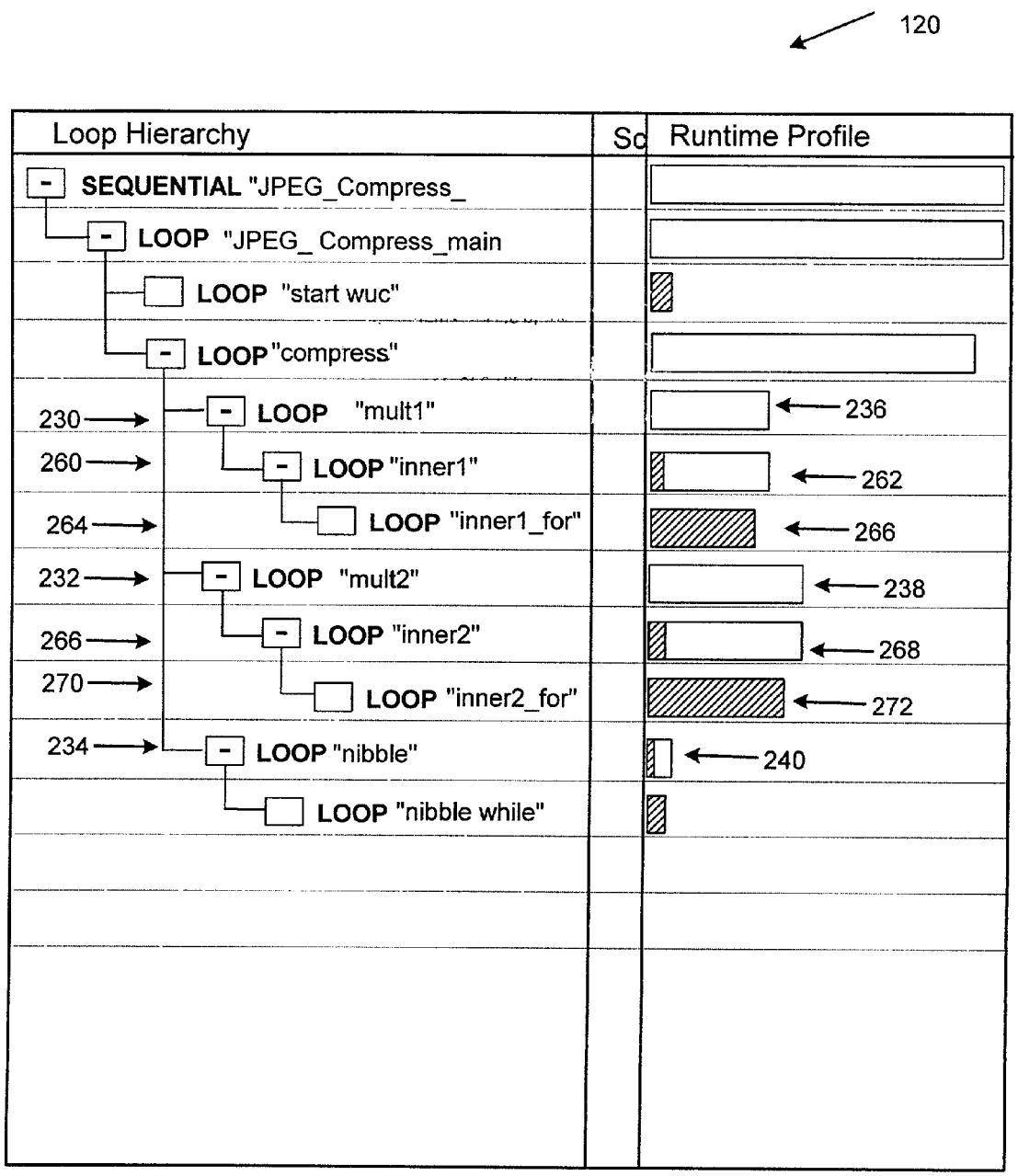
FIG. 9 is an illustration of a graphical user interface displaying process scheduling including expanded decedent relations and shading representing execution time within loops.

In this example, since bars 236 and 238 indicate they have a child loop doing considerable work, the designer expands the tree structure (by clicking the plus signs), and produces FIG. 9.

In FIG. 9, upon expanding the tree under "mult1" 230, the designer discovered loop "inner1" 260 which is mostly a lighter shade 262. The lighter shade indicates work being done by one of its children. So, the designer expands the tree under loop "inner1" 260, and discovers a loop "inner1_for" 264, which is 100% dark shade 266. This darker shade 266 indicates that the loop does most of the work (high execution time). Thus, the runtime profile panel graph has been instrumental in discovering a loop "inner1_for" 264, where the relative execution time is very high. Notice also, that "inner1_for" loop has no children. This is apparent since the box directly in front of "inner1_for" 264 contains no plus sign ("+"). Since it has no children loops, no portion of its bar 266, has any white indicating work done by a child.

Further, since "inner1" 260 has only one child, "inner1_for" 264, the dark shade in the child bar 266, is equal to the light shade in the parent bar 262.

Finally, when expanding the tree under "mult2" 232, the designer discovered loop "inner2" 266 which is mostly a lighter shade bar 268. The lighter shade indicates a child loop doing a majority of the work. So the designer then expands the tree under loop "inner2" 266, and discovers a loop "inner2_for" 270 which is 100% dark shade 272. The dark shade indicates that the loop does most of the work. Thus, the runtime profile panel graph has been instrumental in discovering a loop "inner1_for" 264, where the relative execution time is very high. By discovering a few loops with high relative execution time 266, 272, the designer now knows several good candidates for unrolling or pipelining.

Thus, FIG. 9 shows a relative relationship between loops and their corresponding execution time. In general, we see that work done within a loop can be represented in one color or shade, while work done within a child loop or loops can be represented as a different shade or color. Information organized in this way is particularly valuable to a designer who can reduce latency by focusing on areas of the design (i.e., loops) with the greatest relative execution time. For example, if a designer unrolls or pipelines only a few loops that together represent the a high relative execution time as compared to other loops (e.g., as represented by bars 266 and 272), then latency can be reduced efficiently.

Figure 10:
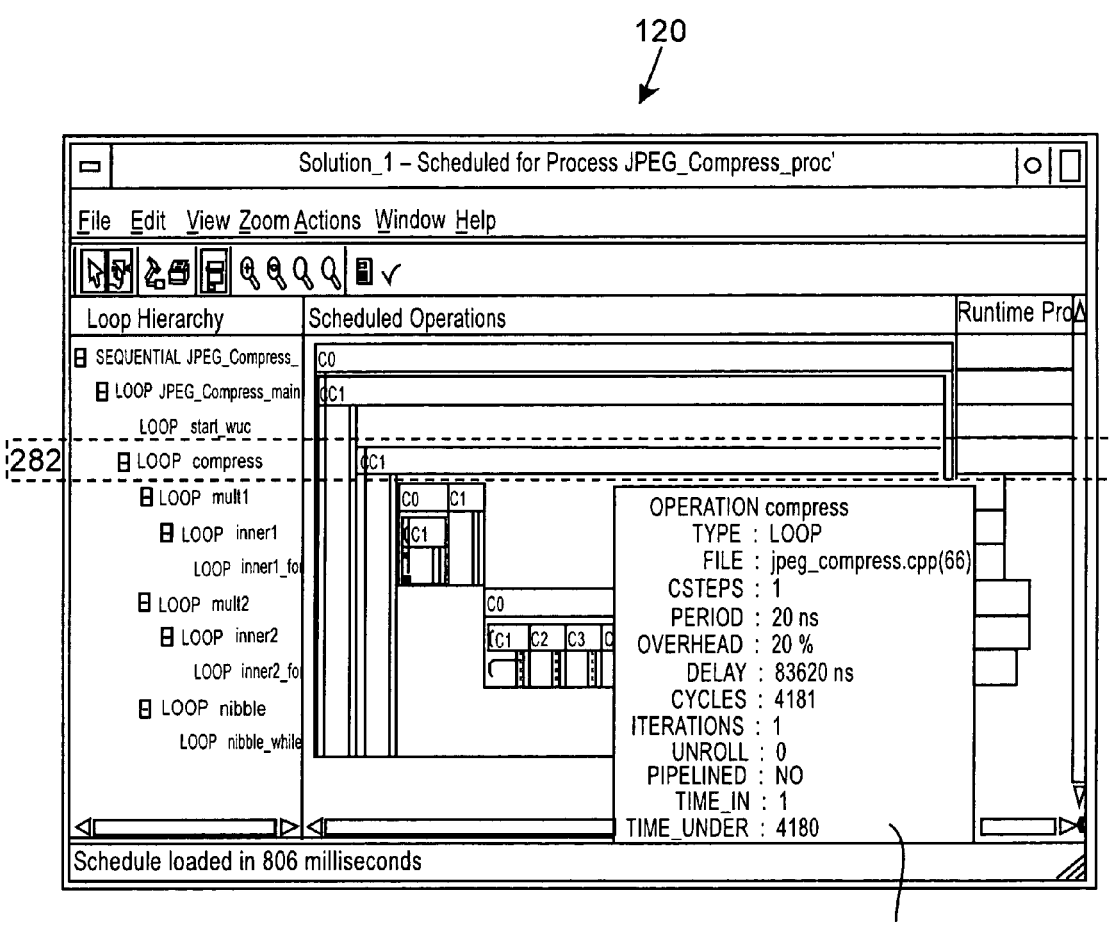
FIG. 10 is an illustration of a graphical user interface displaying process scheduling including a fly over window showing detailed loop information.

FIG. 10 shows a flyer over feature of the process schedule user interface 120. When a user places the cursor over the horizontal line representing the loop "compress" 282, a pop-up window supplies the designer with relevant information. For example the name of the loop, whether the loop is pipelined and/or unrolled or not, the number of cycles in the loop, the number of cycles under the loop, the total time for the loop, the relative time, etc.

Figure 11:
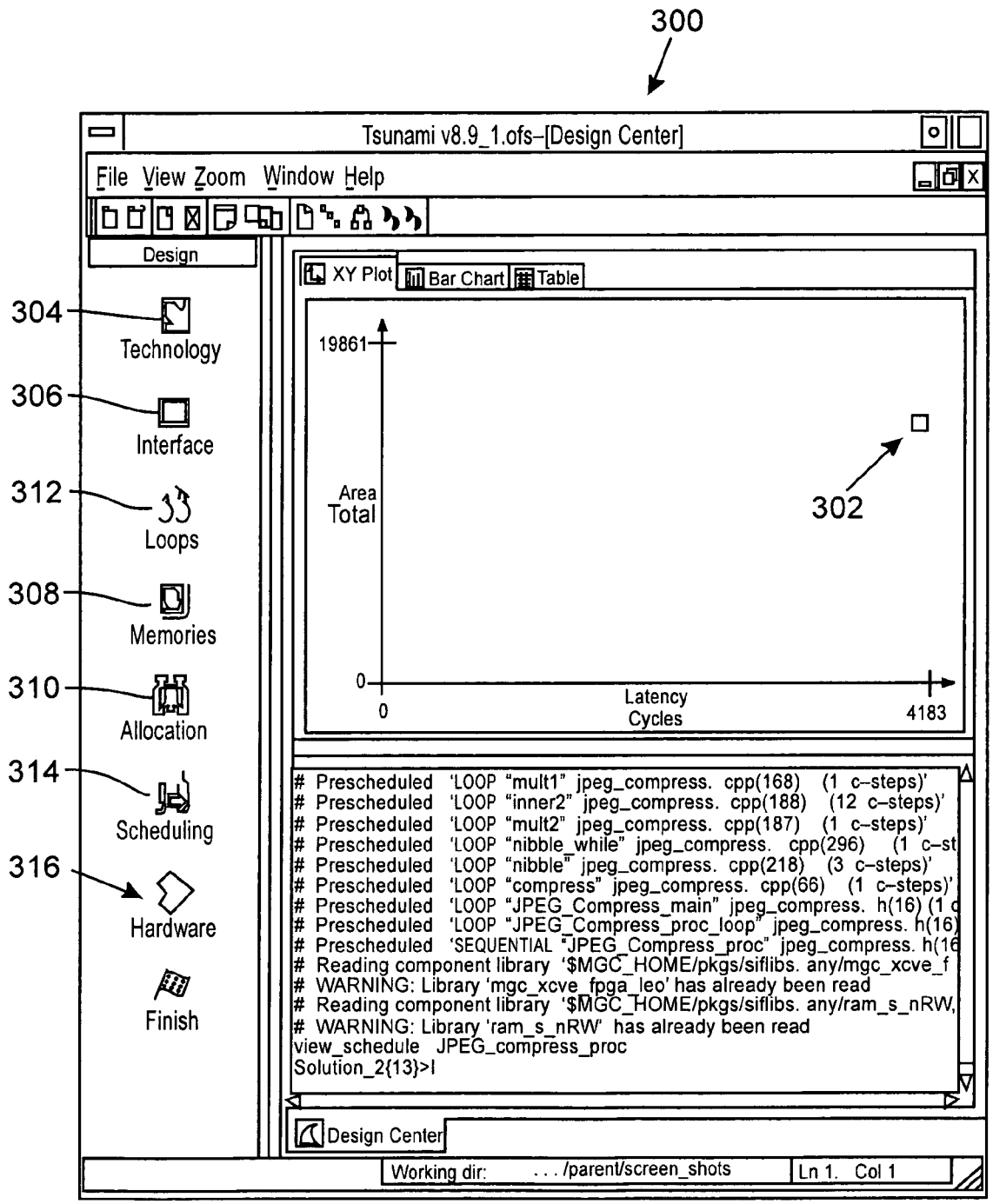
FIG. 11 is an illustration of a graphical user interface displaying a latency versus area graph.

FIG. 11 shows an area versus latency graph used to show the present condition of the proposed hardware circuit under design. The X axis shows the number of cycles (i.e., latency) needed to run the source code using the proposed hardware circuit design. The Y axis shows the area required to hold the hardware for the proposed hardware circuit design. In some cases, the designer has restricted area but more time. In other cases the designer has restricted time but more area. In yet other cases, the designer is constrained in both area and time. After reading in the source code, and identifying loops, the design tool calculates calculates the execution time and produces a data point 302 which represents the time and latency for the start state design. If the design needs improvement, the designer has several options.

In the illustrated embodiment, the GUI 300 presents the designer with certain options in the form of selectable icons (i.e., 304–316). Selecting these icons, will produce one of the following options, preferably within an interactive GUI. The designer can select the type and speed of the technology for the design 304 (not shown). The designer can select the clock speed for the design 306 (not shown). The designer can alter the memory used in the design 308 (not shown), and make other hardware selections and changes 310. The designer can also unroll or pipeline selected loops 312 using the described loop constraints user interface (FIG. 4, 70) before or after viewing the runtime profile panel in the process schedule interface (FIG. 5, 150). Upon obtaining a desirable data point 302, the designer can complete the hardware design process 316 (FIG. 3, 52–59). If the designer selects a loop icon 312, the loop constraint user interface is obtained (FIG. 12).

The designer can alter the loop constraints using the loop constraint user interface (FIG. 12). In this case, since "inner2_for" (as shown in FIG. 9, bar 272) is a good candidate for unrolling, in FIG. 12, the designer selects 330 to unroll "inner2_for". Further, in FIG. 13, the designer selects a loop for pipelining 334. Upon making several changes in the loop constraint user interface, at FIG. 14, the designer applies 336 the changes, and then at FIG. 15, the view shows how the changes affected the design in the process schedule user interface 120.

Figure 15:
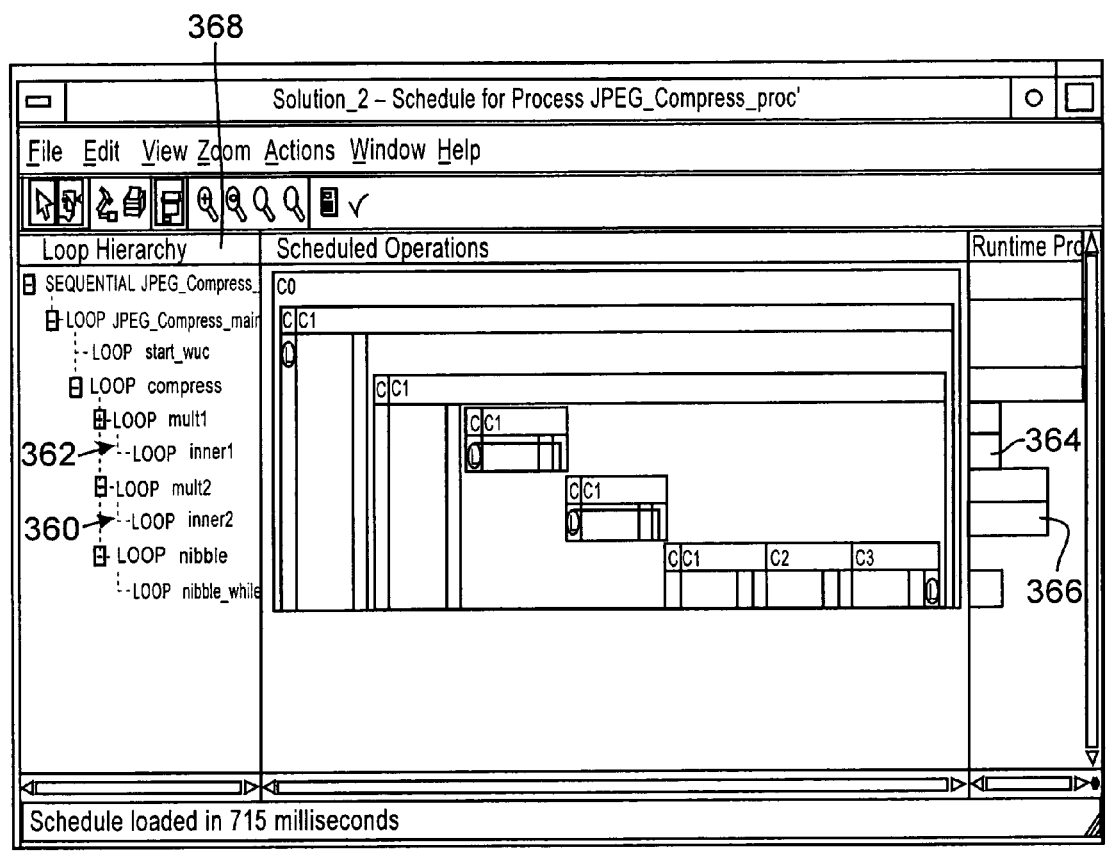
FIG. 15 is an illustration of a graphical user interface displaying process scheduling including displaying the changes made in FIGS. 12–14.
Figure 16:
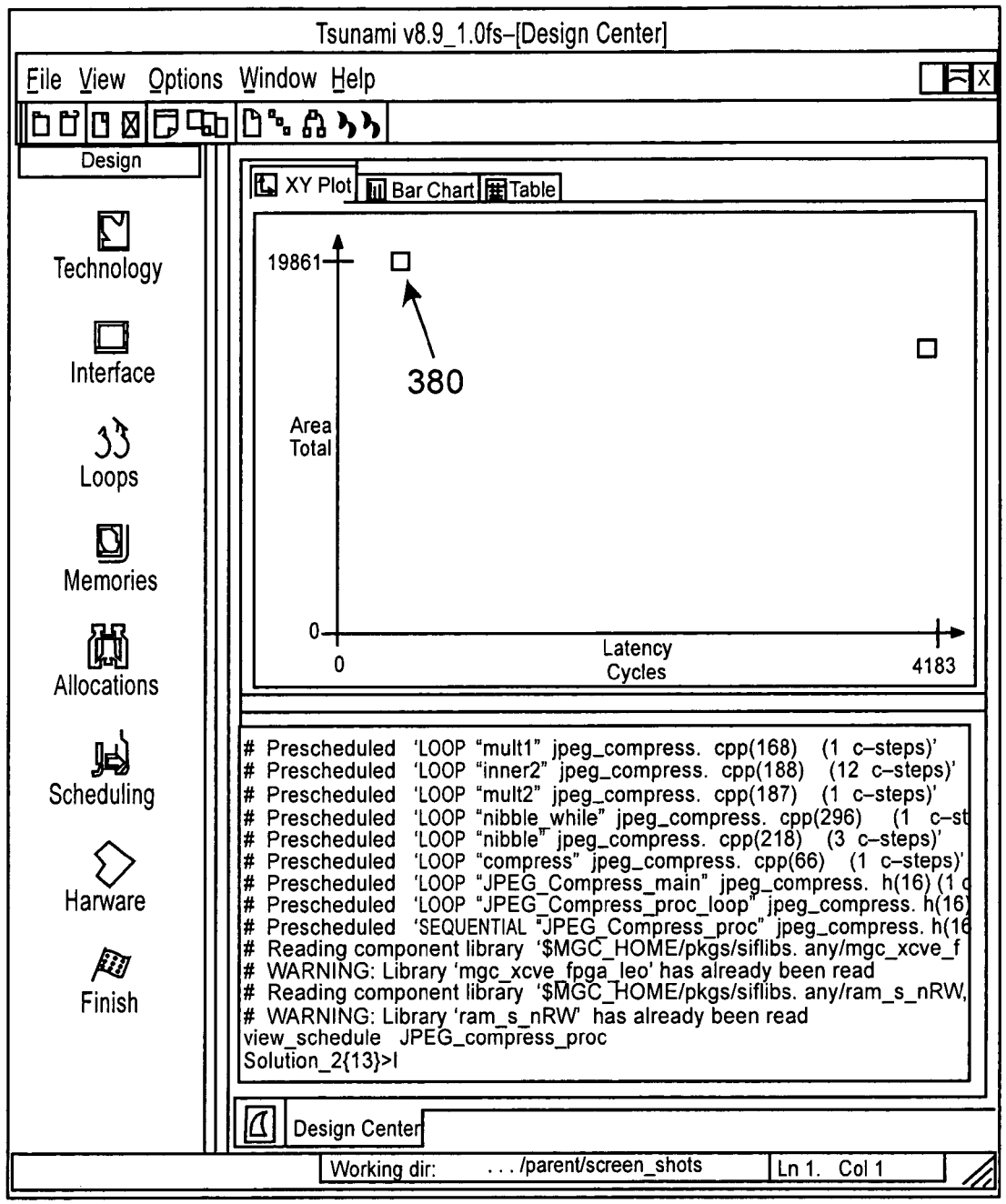
FIG. 16 is an illustration of a graphical user interface displaying a latency versus area graph showing the data point with improved latency.

In FIG. 15, since the designer rolled out loops "inner1_for" and "inner2_for", these loops no longer appear in the loop hierarchy panel 368, but instead they are contained as unrolled within their parents, respectively loop "inner1" 362 and "inner2" 360. Although the work has shifted to their parents' bars, respectively 364, and 366, FIG. 16 shows that the altered loop constraints have reduced the overall design latency 380. Thus, the relative presentation of calculated execution time (e.g., FIG. 9, bars 266 and 272) allowed the designer to immediately and efficiently alter the design in a substantial time saving way.

FIG. 17 shows how a numeric or percentage chart could be used to convey the useful information.

Figure 18:
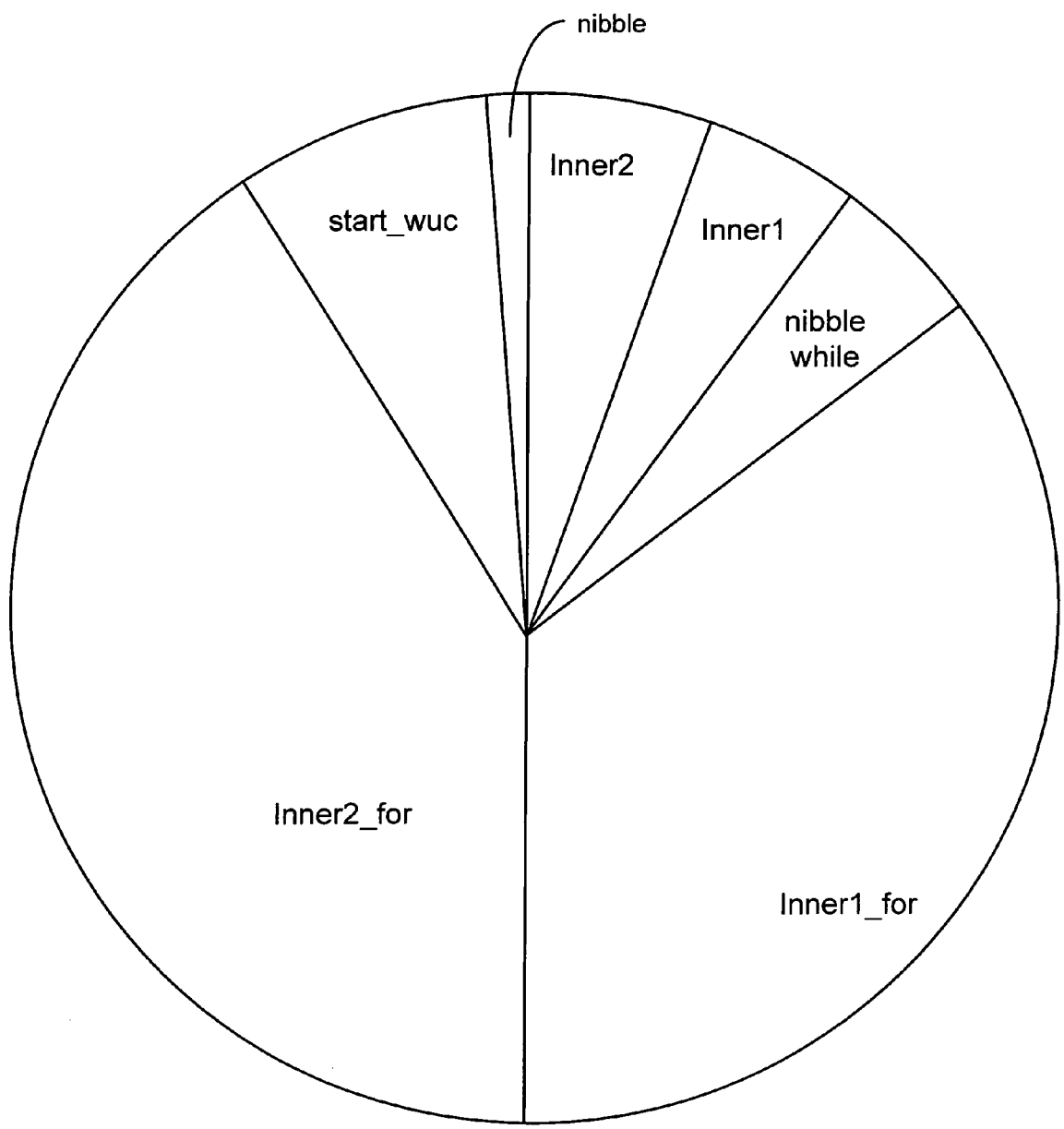
FIG. 18 is an illustration of an alternative relative loop analysis display using a pie chart.

FIG. 18 shows how a pie chart could be used to convey the information.

Figure 19:
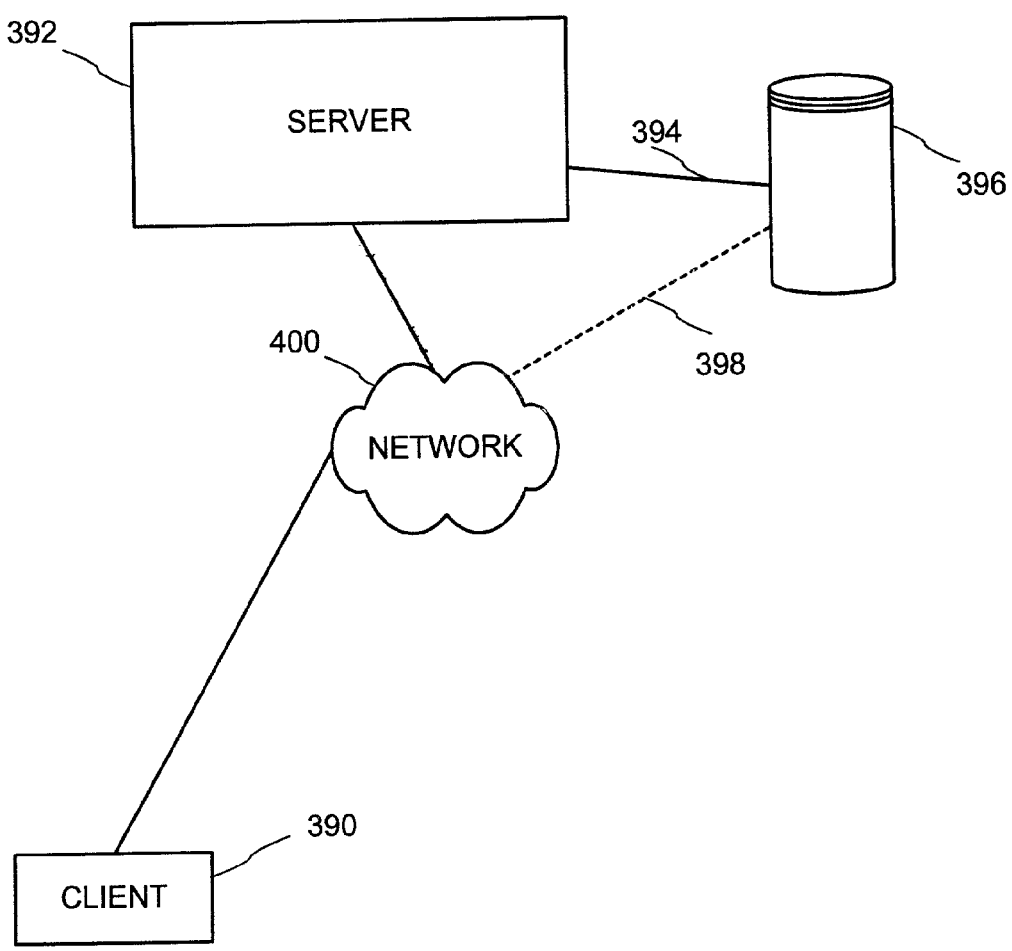
FIG. 19 is an illustration of a network environment supporting a distributed client-server embodiment.

FIG. 19 is a network configuration supporting the illustrated embodiment. In such a network environment a distributed application would have a client computer 390 which communicates with a server computer 392. In such an arrangement some functionality of the described behavioral synthesis tool could execute on the client side 390, while other functionality could execute on the server side 392. Data used to support the system could be housed on the client 390 or the server 392, or on a database 396 accessible to the server possibly at a third location accessible to the server directly 394, or accessible to the client or server over the network 398. The network could be the Internet 400. Such an arrangement may be suitable to an application service provider scenario. In such a case, the client could be a thin client (e.g., an Internet browser).

Figure 20:
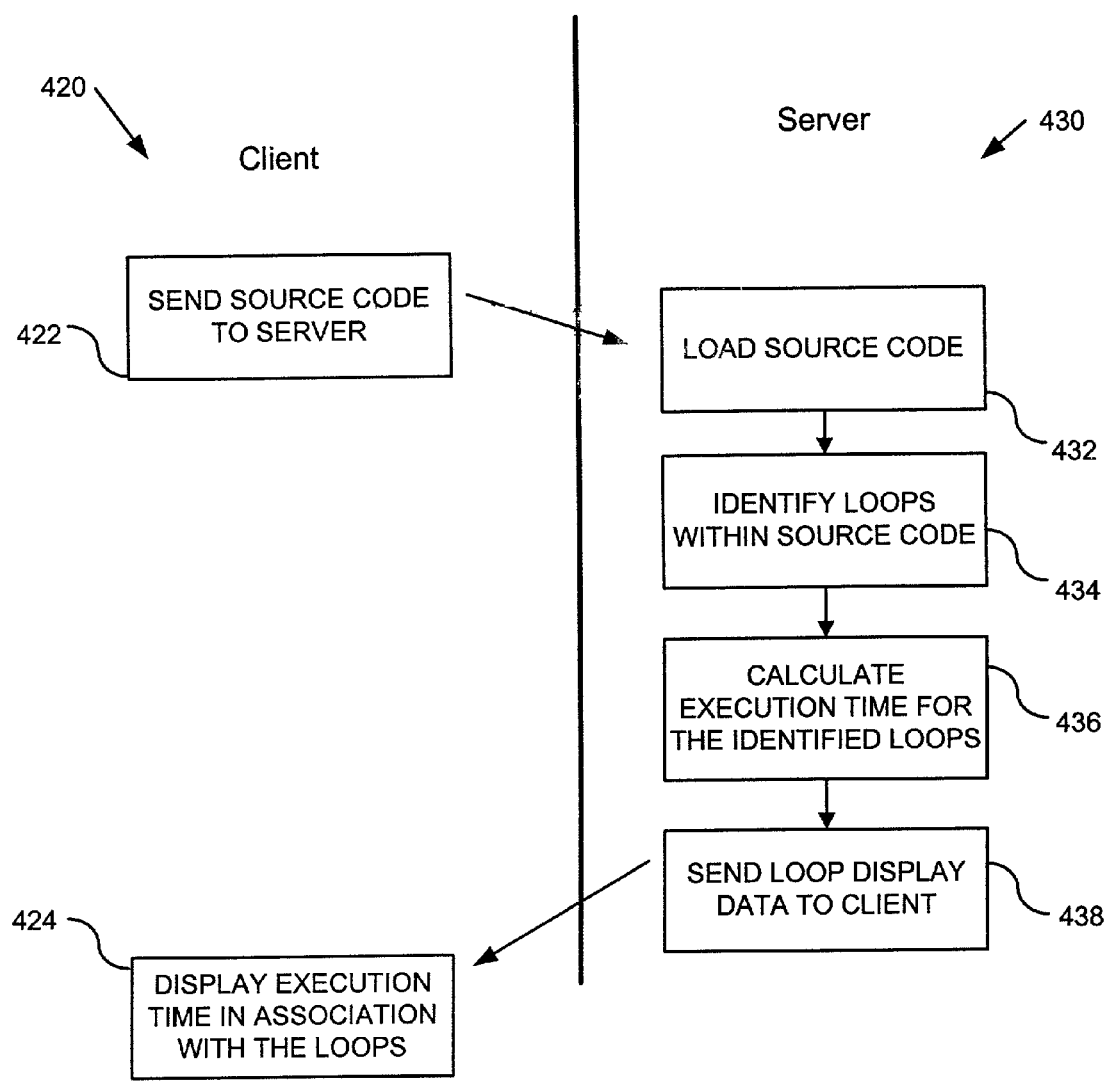
FIG. 20 is a design flow for one potential distributed client-server embodiment.

FIG. 20 shows one embodiment of a distributed system. A client 420 could send source code to a server computer 422. The server could load the source code 432, identify loops within the source code 434, calculate execution time for the identified loops 436, and send display data to the client 438. The client could then display the relative runtime results 424. In another embodiment, the interactive design changes described herein, could be employed. For example, design changes could be returned to the server 430, recalculated by the server 434–436, and new display data returned to the client for display 438. All the same functionality could be provided in such a distributed environment.

Having described and illustrated the principles of our invention with reference to an illustrated embodiment, it will be recognized that the illustrated embodiment can be modified in arrangement and detail without departing from such principles. It should be understood that the programs, processes, or methods described herein are not related or limited to any particular type of computer apparatus, unless indicated otherwise. Various types of general purpose or specialized computer apparatus may be used with or perform operations in accordance with the teachings described herein. Elements of the illustrated embodiment shown in software may be implemented in hardware and vice versa.

In view of the many possible embodiments to which the principles of our invention may be applied, it should be recognized that the detailed embodiments are illustrative only and should not be taken as limiting the scope of our invention. Rather, we claim as our invention all such embodiments as may come within the scope and spirit of the following claims and equivalents thereto.

We claim:

1. In a behavioral synthesis tool used to design a hardware circuit, a method comprising:
   identifying loops within a source code representation of a hardware circuit;
   calculating an estimate of hardware execution time for the identified loops; and
   displaying the estimate of hardware execution time in association with the identified loops, wherein the displayed execution time for a parent loop is represented as a bar graph, and the bar graph of the parent loop represents the execution time of a child loop as a different shade or color.

2. The method of claim 1, further comprising:
   receiving via a graphical user interface, an indication to unroll a specified loop;
   unrolling the specified loop;
   calculating the execution time for the unrolled loop; and
   displaying the execution time associated with the loops including the unrolled loop.

3. The method of claim 2, wherein unrolling means unrolling without changing the source code.

4. The method of claim 2, wherein an integrated circuit is created containing the unrolled loop.

5. The method of claim 1, further comprising:
   receiving via a graphical user interface, an indication to pipeline a specified loop;
   pipelining the specified loop;
   calculating the execution time for the pipelined loop; and
   displaying the execution time associated with the loops including the pipelined loop.

6. The method of claim 5, wherein pipelining means pipelining without changing the source code.

7. The method of claim 1, wherein the displayed execution time for the identified loops is represented as relative to the execution time of the other identified loops.

8. The method of claim 1, wherein calculating comprises:
   for each loop, summing the time required to complete the hardware instructions within the loop; and
   multiplying the time required to complete the hardware instructions within a loop by the number of iterations of the loop.

9. The method of claim 1, wherein identifying means reading loop directive identifiers in the source code.

10. In a behavioral synthesis tool used to design a hardware circuit, a method comprising:
    identifying loops within a source code representation of a hardware circuit;
    calculating an estimate of hardware execution time for the identified loops; and
    displaying the estimate of hardware execution time in association with the identified loops, wherein the displayed execution time for a loop is represented as a bar, and the bar represents the execution time in the loop as a shade or color, and the bar represents the execution time of a descendent loop as a different shade or color.

11. In a behavioral synthesis tool used to design a hardware circuit, a method comprising:
    identifying loops within a source code representation of a hardware circuit;
    calculating an estimate of hardware execution time for the identified loops; and
    displaying the estimate of hardware execution time in association with the identified loops, wherein the displayed execution time for the loops are a bar graph, and a bar representing a parent loop is greater than or equal to the sum of the bars representing its child loops.

12. The method of claim 11, further comprising:
receiving via a graphical user interface, an indication to unroll a specified loop;
unrolling the specified loop;
calculating the execution time for the unrolled loop; and
displaying the execution time associated with the loops including the unrolled loop.

13. The method of claim 12, wherein unrolling means unrolling without changing the source code.

14. The method of claim 12, wherein an integrated circuit is created containing the unrolled loop.

15. The method of claim 11, further comprising:
receiving via a graphical user interface, an indication to pipeline a specified loop;
pipelining the specified loop;
calculating the execution time for the pipelined loop; and
displaying the execution time associated with the loops including the pipelined loop.

16. The method of claim 15, wherein pipelining means pipelining without changing the source code.

17. The method of claim 11, wherein the displayed execution time for the identified loops is represented as relative to the execution time of the other identified loops.

18. The method of claim 11, wherein calculating comprises:
for each loop, summing the time required to complete the hardware instructions within the loop; and
multiplying the time required to complete the hardware instructions within a loop by the number of iterations of the loop.

19. The method of claim 11, wherein identifying means reading loop directive identifiers in the source code.

20. In a behavioral synthesis tool used to design a hardware circuit, a method comprising:
identifying loops within a source code representation of a hardware circuit;
calculating an estimate of hardware execution time for the identified loops; and
displaying the estimate of hardware execution time in association with the identified loops, wherein calculating comprises:
assigning hardware instructions within a loop to clock cycles within a loop thereby obtaining a number of clock cycles within the loop;
for non-pipelined loops, using the following equation: (number of clock cycles within the loop*number of loop iterations); and
for pipelined loops, using the following equation: (number of clock cycles within the loop+(initiation interval*(number of loop iterations −1))), wherein the initiation interval comprises a number of clock cycles before the pipelined loops process new input data.

21. In a behavioral synthesis tool used to design a hardware circuit, a method comprising:
identifying loops within a source code representation of a hardware circuit;
calculating an estimate of hardware execution time for the identified loops; and
displaying the estimate of hardware execution time in association with the identified loops, wherein the displayed estimate of hardware execution time is within an interactive graphical user interface which includes a representation of hardware operations within loops, and a loop-only button removes hardware operations from the representation.

22. In a behavioral synthesis tool used to design a hardware circuit, a method comprising:
identifying loops within a source code representation of a hardware circuit;
calculating an estimate of hardware execution time for the identified loops, wherein calculating comprises:
assigning hardware instructions within a loop to clock cycles within a loop thereby obtaining a number of clock cycles within the loop;
for non-pipelined loops, using the following equation: (number of clock cycles within the loop*number of loop iterations); and
for pipelined loops, using the following equation: (number of clock cycles within the loop+(initiation interval*(number of loop iterations −1))), wherein the initiation interval comprises a number of clock cycles before the pipelined loops process new input data; and
displaying the estimate of hardware execution time in association with the identified loops, wherein the displayed execution time for the loops is represented as a bar graph, a pie graph, a numeric graph, a graphic comparison or a numeric comparison.

23. The method of claim 22, wherein the displayed execution time for the identified loops is represented as relative to the execution time of the other identified loops.

24. The method of claim 22, wherein calculating comprises:
for each loop, summing the time required to complete the hardware instructions within the loop; and
multiplying the time required to complete the hardware instructions within a loop by the number of iterations of the loop.

25. The method of claim 22, wherein the act of identifying loops comprises reading loop directive identifiers in the source code.

26. In a behavioral synthesis tool used to design a hardware circuit, a method comprising:
identifying loops within a source code representation of a hardware circuit;
calculating an estimate of hardware execution time for the identified loops; and
displaying the estimate of hardware execution time in association with the identified loops, wherein the displayed execution time for the loops is represented as a bar graph, a pie graph, a numeric graph, a graphic comparison or a numeric comparison, wherein the displayed execution time for a parent loop is represented as a bar graph, and the bar graph of the parent loop represents the execution time of a child loop as a different shade or color.

27. The method of claim 26, wherein the displayed execution time for the identified loops is represented as relative to the execution time of the other identified loops.

28. The method of claim 26, wherein calculating comprises:
for each loop, summing the time required to complete the hardware instructions within the loop; and
multiplying the time required to complete the hardware instructions within a loop by the number of iterations of the loop.

29. The method of claim 26, wherein the act of identifying loops comprises reading loop directive identifiers in the source code.

* * * * *